United States Patent [19]

Maly et al.

[11] Patent Number: 5,051,951
[45] Date of Patent: Sep. 24, 1991

[54] STATIC RAM MEMORY CELL USING N-CHANNEL MOS TRANSISTORS

[75] Inventors: Wojciech Maly; Pranab K. Nag, both of Pittsburgh, Pa.

[73] Assignee: Carnegie Mellon University, Pittsburgh, Pa.

[21] Appl. No.: 653,859

[22] Filed: Feb. 8, 1991

Related U.S. Application Data

[63] Continuation of Ser. No. 431,756, Nov. 6, 1989, abandoned.

[51] Int. Cl.[5] .................... G11C 11/412; G11C 11/24
[52] U.S. Cl. .................................. 365/150; 365/154; 365/185; 357/23.5; 357/51
[58] Field of Search ............... 365/154, 150, 185, 149; 357/23.5, 51

[56] References Cited

U.S. PATENT DOCUMENTS

| | | | |
|---|---|---|---|
| 4,128,773 | 12/1978 | Troutman et al. | 365/185 |
| 4,132,904 | 1/1979 | Harari | 365/185 |
| 4,342,101 | 7/1982 | Edwards | 365/185 |
| 4,387,444 | 6/1983 | Edwards | 365/185 |
| 4,423,491 | 12/1983 | Tickle | 365/154 |
| 4,435,786 | 3/1984 | Tickle | 365/154 |
| 4,460,978 | 7/1984 | Jiang et al. | 365/154 |
| 4,467,451 | 8/1984 | Moyer | 365/185 |
| 4,510,584 | 4/1985 | Dias et al. | 365/203 |
| 4,541,073 | 9/1985 | Brice et al. | 365/185 |
| 4,571,704 | 2/1986 | Bohac | 365/185 |
| 4,748,593 | 5/1988 | Topich, deceased et al. | 365/190 |
| 4,760,556 | 7/1988 | Deguchi et al. | 365/149 |
| 4,803,662 | 2/1989 | Tanaka | 365/185 |
| 4,809,225 | 2/1989 | Dimmler et al. | 365/145 |
| 4,813,018 | 3/1989 | Kobayashi et al. | 365/185 |

FOREIGN PATENT DOCUMENTS

| | | |
|---|---|---|
| 0085994 | 5/1983 | Japan . |
| 0079489 | 5/1984 | Japan . |
| 0162694 | 9/1984 | Japan . |

OTHER PUBLICATIONS

Wojciech Maly, Pranab K. Nag & Phil Nigh, "Testing Oriented Analysis of CMOS ICs with Opens", CH2657-5/88/0000/0344 IEEE, 1988.

Primary Examiner—Joseph E. Clawson, Jr.
Attorney, Agent, or Firm—Henry K. Woodward

[57] ABSTRACT

A floating gate NMOS enhancement mode transistor is utilized in an NMOS SRAM thereby reducing power consumption, size, and circuit complexity of the memory cell. The gate of the load transistor is allowed to float with no galvanic connection to the memory cell circuit. A bias voltage is induced on the gate of the load transistor by capacitances of the gate with the source, the drain, and the bulk semiconductor, and the conductance is maintained below conduction threshold. Gate bias is established by tailoring of the gate capacitances and by the removal of charge using UV light as necessary.

6 Claims, 3 Drawing Sheets

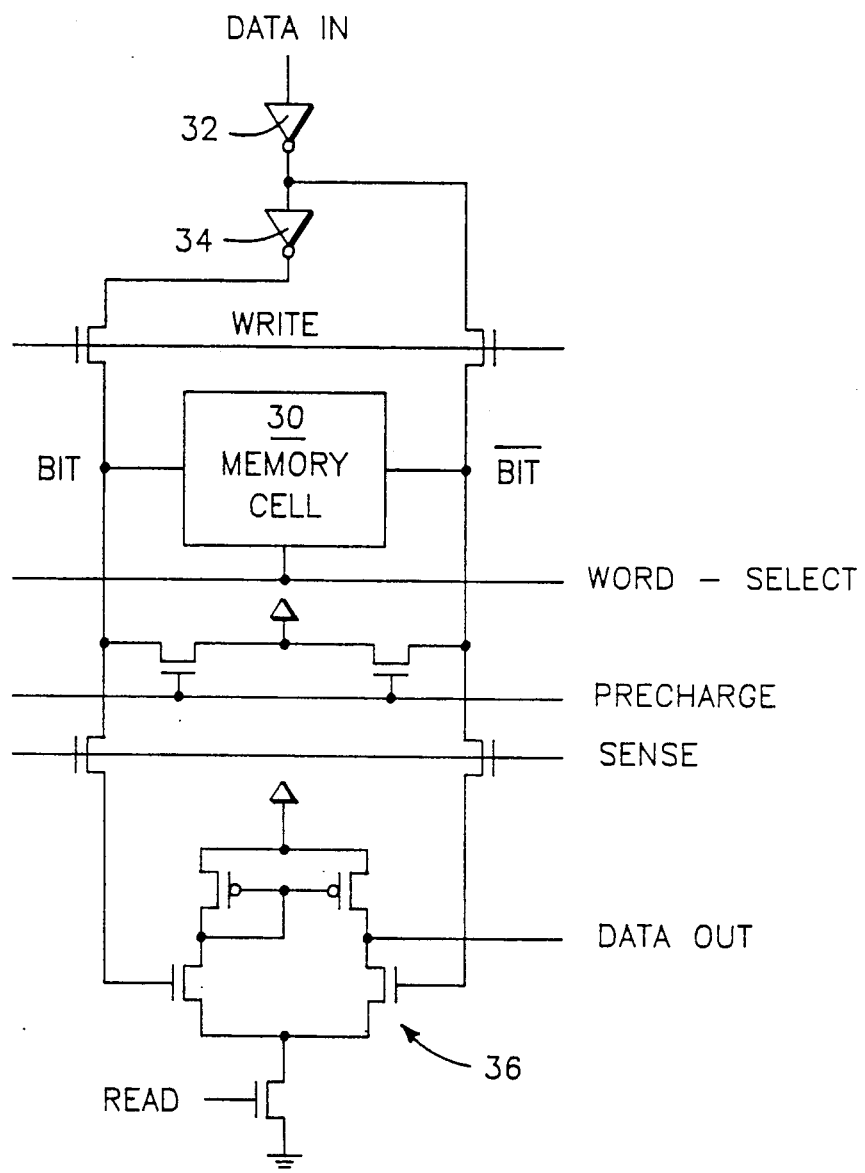
FIG.—6
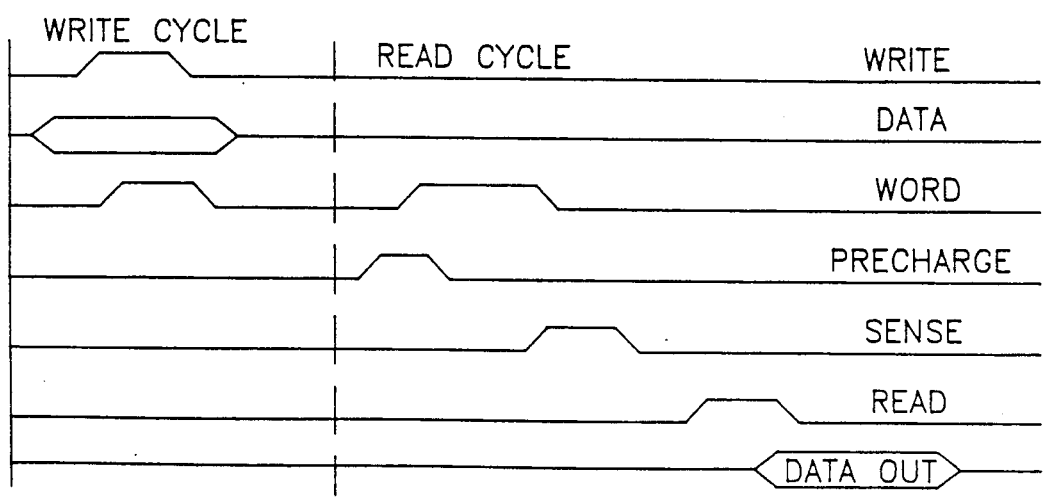
FIG.—7

STATIC RAM MEMORY CELL USING N-CHANNEL MOS TRANSISTORS

This application is a continuation of Ser. No. 07/431,756, filed Nov. 6, 1989, now abandoned.

BACKGROUND OF THE INVENTION

This invention relates generally to static random access memories, and more particularly the invention relates to static random access memories using N-channel enhancement mode transistors.

The static random access memory (SRAM) typically employs cross-coupled transistors which are connected to load transistors. The common nodes of the load transistors and the cross-coupled transistors store data as bit and $\overline{bit}$. The writing of data into the memory cell creates a voltage differential at the two nodes which is perpetuated by the circuitry. The conventional six transistor SRAM memory cell includes two word select transistors connected to the two memory nodes.

Heretofore, SRAMs employing MOS transistors have typically employed, complementary MOS transistor pairs with the P-channel transistors functioning as loads for the cross-coupled N-channel transistors. Such circuits consume low power, but the necessity of doped wells in forming the complementary transistor pair increases the size of the cell and increases the complexity of device fabrication. N-channel memory cells have been fabricated, and such cells are smaller in size than CMOS memory cells. However, the N-channel cells have heretofore utilized depletion mode transistors with enhancement mode cross-coupled transistors. The depletion mode device must be suitably biased to provide the requisite loads.

The present invention is directed to a novel SRAM memory cell employing N-channel enhancement mode transistors which is small in size and low in power consumption.

SUMMARY OF THE INVENTION

Accordingly, an object of the invention is an improved N-channel transistor SRAM cell.

Another object of the invention is an SRAM cell using only enhancement mode NMOS transistors in the memory cell.

A feature of the invention is the use of floating gate NMOS enhancement mode transistors as load devices in the memory cell.

Briefly, in a preferred embodiment of the invention a memory cell comprises six NMOS transistors with two transistors being cross-coupled drive transistors, two transistors being floating-gate load devices, and two transistors being word-select pass transistors. A reduced cell geometry is provided by using only enhancement mode NMOS transistors, and the circuitry is simplified by allowing the gates of the load transistors to float or remain disconnected from any conducting region. Static bias voltage on the floating gate transistors can be established by capacitances between gate and source, gate and drain, and gate and substrate.

The invention and objects and features thereof will be more readily apparent from the following detailed description and appended claims when taken with the drawing.

BRIEF DESCRIPTION OF THE DRAWING

FIG. 6 is a schematic diagram of the SRAM cell of FIG. 2 as an element in a memory array.

FIG. 7 is timing diagrams in the operation of the memory array of FIG. 6.

DETAILED DESCRIPTION OF ILLUSTRATIVE EMBODIMENTS

Figure 1:
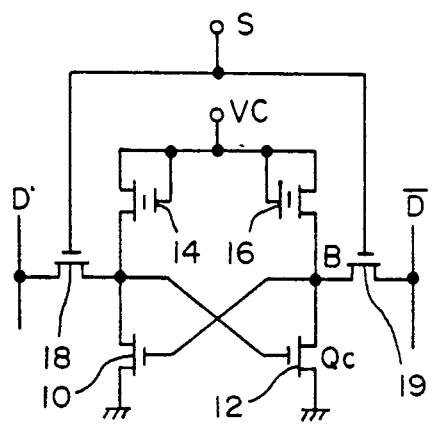
FIG. 1 is a schematic diagram of an SRAM cell in accordance with the prior art.

Referring now to the drawing, FIG. 1 is a schematic diagram of a conventional six transistor SRAM cell in accordance with the prior art. Two MOS transistors 10 and 12 have cross-coupled source and gate electrodes, and load transistors 14 and 16 serially connected transistors 10 and 12, respectively, to a voltage $V_{CC}$. In this embodiment the two load transistors have control gate electrodes connected to $V_{CC}$, and the conductance of the two transistors is established by charge on floating control gates between the control electrodes and the channel region of the transistors. In other prior art circuits MOS load transistors have been employed with the conductance of the transistors being controlled by bias voltages connected to the gate electrodes. Data lines D and $\overline{D}$ are connected through data select transistors 18 and 20 to the common nodes A and B of transistors 10, 14 and transistors 12, 16, respectively.

Data is written into the memory cell through select transistors 18, 19 by raising the voltage on one of nodes A, B while the voltage on the opposite node is lowered. The cross-coupled transistors then retain the data as programmed for subsequent readout when the select transistors 18, 20 are rendered conducted by select voltage, S.

As noted above, CMOS transistors pairs have been utilized in SRAM cells, and depletion mode N-channel transistors have been used for the load transistors with cross-coupled enhancement mode N-channel transistors. However, all of these prior circuits have limitations in design complexity, and the CMOS transistors require more surface area due to the need for doped wells.

Figure 2:
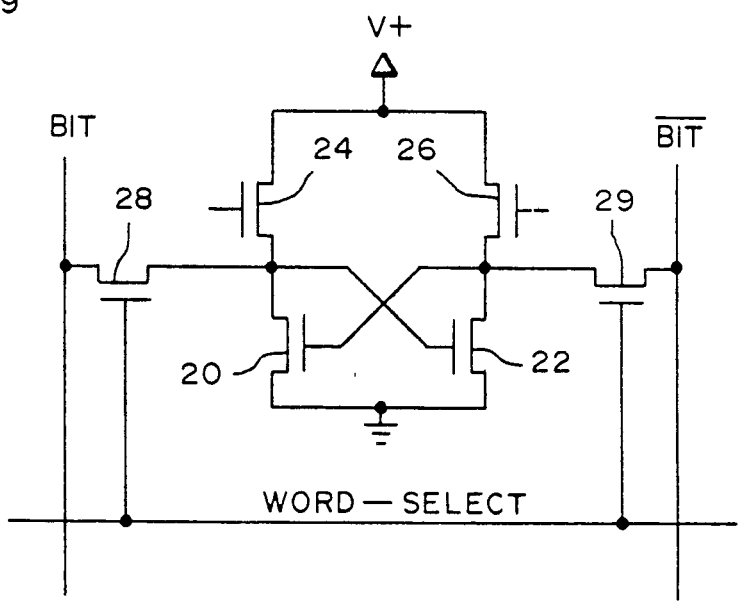
FIG. 2 is a schematic diagram of an SRAM cell in accordance with the present invention.

FIG. 2 is a schematic diagram of an SRAM cell in accordance with the present invention which utilizes six enhancement mode N-channel transistors. Again, the cross-coupled transistors 20, 22 have the source of one transistor connected to the gate of the other transistor. Load transistors 24 and 26 are serially connected with the cross-coupled transistors 20, 22, respectively, between a plus voltage potential, V+, and ground. Select transistors 28 and 29 connect the nodes A, B to bit and $\overline{bit}$ lines, respectively. The gates of the select transistors 28, 29 are connected to a word select line which activates the transistors for writing and reading of data in the memory cell.

Figure 3A:
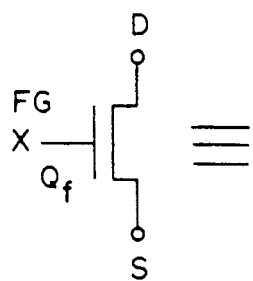
FIGS. 3A and 3B are a schematic of a floating gate MOS transistor and its equivalent circuit, respectively.
Figure 3B:
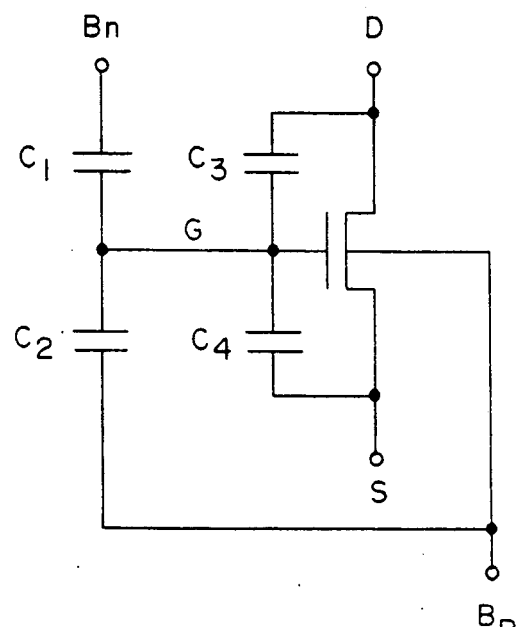

A feature of the memory cell of FIG. 2 is the use of MOS transistors 24, 26 in which the control gate electrodes are allowed to float; that is, the gate electrode has no galvanic connection to any other node in the circuit. In a polysilicon gate transistor, the polysilicon is not connected to any conducting region. The behavior of such a transistor has been investigated by applicants and reported in Maly, Nag, and Nigh "Testing Oriented Analysis of CMOS ICs with Opens" ICCAD, November 1988. FIGS. 3A and 3B are a schematic of a floating gate MOS transistor and its equivalent circuit as reported on therein. The transistor is characterized by four capacitances including a gate to N-type semiconductor bulk capacitor C1, a gate to P-type semiconductor bulk transistor C2, a gate to drain capacitor C3, and a gate to source capacitor C4. The paper notes that such a transistor acts as a weakly "on" active load which can present a fault in a VLSI circuit. Such a fault can be detected by monitoring static current through the power busses.

Figure 4A:
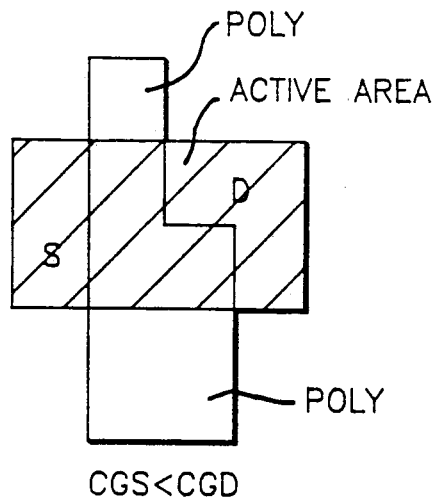
FIGS. 4A and 4B are plan views of two floating gate transistors having different internal gate capacitances.
Figure 4B:
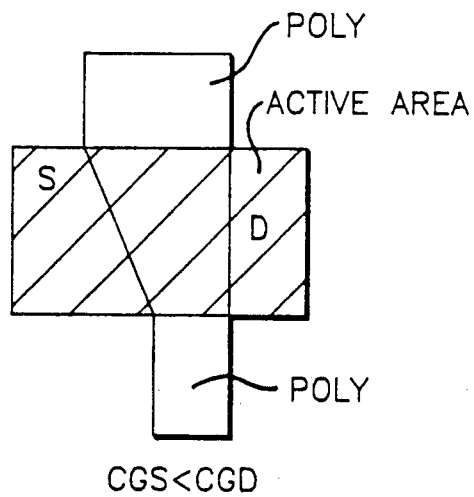

In accordance with a feature of the present invention the weakly "on" load of a floating gate transistor is advantageously utilized in a SRAM cell thereby simplifying circuit design and fabrication by permitting all transistors of the cell to be NMOS enhancement mode devices and without the requirement for interconnecting the gate electrodes of the load transistors to any voltage potential or other node of the circuit. The voltage at the floating gate is determined by initial charge collected on the polysilicon gate during fabrication and the ratio of capacitances between gate-source, gate-drain, and gate-bulk. The voltage on the gate can be modified by appropriate modifications of the ratio of the gate-source and gate-drain overlap capacitances, as illustrated in FIGS. 4A and 4B, and by the use of UV light to remove process induced charges at the gate. FIGS. 4A and 4B are plan views of two MOS transistors showing the overlap of the polysilicon gate with the source and drain regions. In FIG. 4A the gate to source capacitance, CGS, is less than the gate to drain capacitance CGD. However, by reshaping the polysilicon gate as shown in FIG. 4B, CGS is greater than CGD. Such shaping of the gate capacitances can be utilized in determining the amount of load presented by each of the floating gate transistors.

Figure 5:
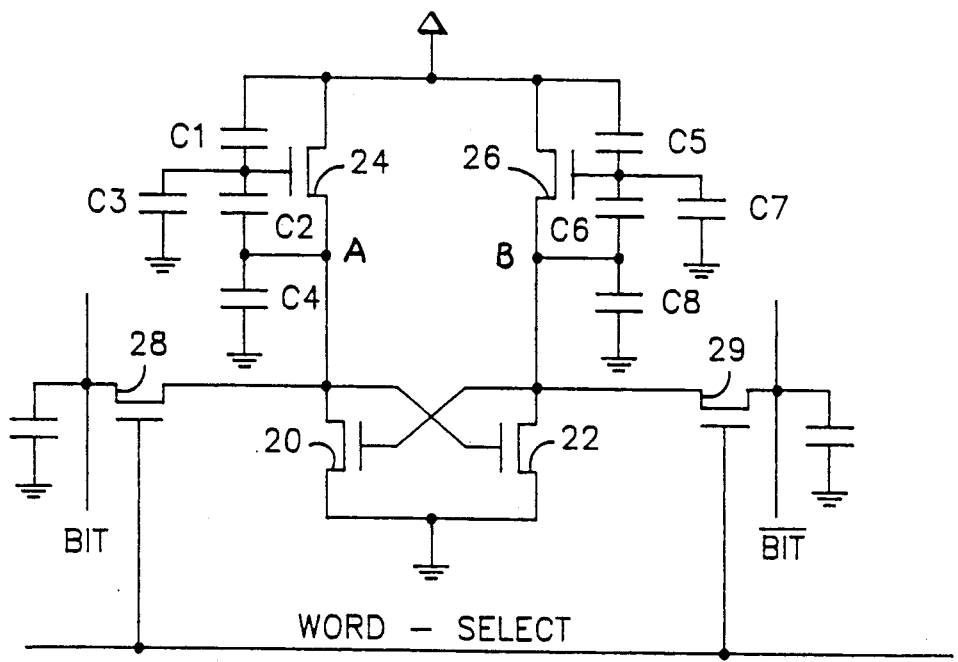
FIG. 5 is a schematic diagram of a circuit equivalent to the SRAM cell of FIG. 2.

FIG. 5 is a schematic diagram of the SRAM cell of FIG. 2 showing the equivalent capacitances of the load transistors 24, 26 as illustrated in FIG. 3B. The bulk capacitances are redrawn to show the effective capacitance of the gate-to-ground (C3, C7) and the source-to-ground capacitances (C4, C8).

In the operation of the cell in FIGS. 2 and 5, assume that there is no initial charge on the floating gate transistors. During power up the nodes A and B assume a voltage satisfying an equilibrium condition where the voltages on gates of transistors 24, 26 rise until they reach subthreshold voltages. Any discrepancies in the cell will cause one of the nodes A, B to have higher voltage which will cause a difference in currents through the cross-coupled transistors 20, 22 and consequently the transistor with the low voltage on the source will be on the edge of conduction while the other transistor will conduct, depending on the ratios of the capacitors C1, C2 and C5, C6 and the source voltage.

During a write cycle when the bit and $\overline{bit}$ lines are pulled high and low, respectively, note A is raised to a higher voltage than node B. The word-select line is pulled high enabling the capacitor C4 and C8 to be charges and discharged, respectively. Node A tends to go high turning transistor 22 on, while node B tends to go low turning transistor 20 off. Hence as in a normal SRAM cell, positive feedback will force the two nodes to go to opposite high and low voltage states. Once the cell is programmed, the programmed state remains stable. When node B is pulled low, it remains lo:; unless node A voltage comes below the threshold of transistor 22. So long as node B is low, transistor 20 cannot turn on and hence node A voltage is controlled by the floating gate transistor 24 which interconnects node A to V+ potential. If node A tries to go down in voltage, transistor 24 will draw more current and again pull the node A up. Hence node A retains its value so long as the voltage is much higher than node B.

During the read cycle the bit lines are precharged to a value just below the high value stored in the cell. In this way the bit lines do not affect the voltage on node A while node B actively pulls down the corresponding bit line. The differential voltage will be large enough to be easily sensed by a simple differential amplifier. Hence, the read operation will not affect the value stored in the cell.

FIG. 6 is a schematic of the memory cell shown at 30 in a memory array. Data is read in through the bit line through serially connected inverters 32 and 34 whereby the date is complimentary on the bit and $\overline{bit}$ lines. A precharge line is provided for charging the bit lines during the read cycle to a value just below the high value stored in the cell. Data out through the sense transistors is detected by a differential amplifier 36. FIG. 7 shows the wave forms of the control signals and data input for a typical read-write cycle.

To verify the operation of the memory cell, four different memory cells have been designed and simulated. In a first circuit, the floating gate transistors have capacitive coupling to the bit lines and to the internal nodes. The cell was made asymmetrical in design. A second circuit similar to the first circuit was designed but with symmetrical floating gate transistors. A third circuit and a fourth circuit were designed in which the gate-source capacitance was increased. The following table is a summary of the simulation results in which TW is the time delay from the point when the word line goes high and nodes A and B change state during a write cycle, and TR is the time delay for a read cycle:

|  | ckt1 | ckt2 | ckt3 | ckt4 |
|---|---|---|---|---|
| Size | 42 × 42 | 54 × 44 | 48 × 41 | 54 × 44 |
| Static Current | 36μ | 46μ | 37μ | 46μ |
| peak current | 400p | 12p | 22p | 7p |
| TW | 5ns | 5ns | 5ns | 5ns |
| TR | 50ns | 40ns | 50ns | 30ns |
| C2/C1 | 1 | 1 | 1 | 3.7 |
| C3/C2 | 2.6 | 3.1 | 2.6 | 2.3 |

Key parameters of the floating gate SRAM cell are the values of the capacitances associated with the floating gate. These capacitances should be designed so that the capacitances coupling the gate of the load transistor to VDD are avoided all together to keep the voltage on the gate low. C2 should be larger than C1. The values of the capacitances of C1, C2, and C3 are selected so that the transistor will be subthreshold under the worst conditions.

There has been described a novel SRAM cell in which all transistors are N-channel enhancement mode devices. The use of floating gate electrode simplifies fabrication and further reduces the size of the cell.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

We claim:

1. A static memory cell comprising first and second MOS transistors each having a source, a drain, and a control gate, third and fourth MOS transistors each having a source, a drain, and a control gate, the control gates of said third and fourth MOS transistors having no galvanic connections, said third and fourth transistors each having control gate capacitances associated with said source, said drain, and one of said voltage storing potentials, the gate-source capacitance being larger than the gate-drain capacitance, said capacitances storing electrical charge for determining the conductance of said third and fourth transistors, means serially connecting said first and third MOS transistors serially between two voltage potentials with said first and third transistors having a first common node, means serially connecting said second and fourth MOS transistors serially between said two voltage potentials with said second and fourth MOS transistors having a second common node, means connecting said first common node to said control gate of said second transistor, means connecting said second common node to said control gate of said first transistor, first and second bit lines, a fifth MOS transistor having a source, a drain, and a control gate connecting said first bit line to said first common node, a sixth MOS transistor having a source, a drain, and a gate connecting said second bit line to said second common node, and a word select line connected to said control gates of said fifth and sixth transistors.

2. The static memory cell as defined by claim 1 wherein said MOS transistors are NMOS enhancement mode transistors.

3. In a static RAM cell having cross-coupled NMOS enhancement mode transistors, a load device for each cross-coupled transistor comprising an NMOS enhancement mode transistor having a source, a drain, and a contact gate, means connecting said drain to a voltage potential, means connecting said source to one of said cross-coupled transistors, and said gate is floating with no galvanic connection to said gate said NMOS enhancement mode transistor having control gate capacitances associated with said source, said drain, and one of said voltage potentials, the gate-source capacitance being larger than the gate-drain capacitance, said capacitances storing electrical charge for determining the conductance of said transistor.

4. The static memory cell as defined by claim 1 wherein said control gate capacitances associated with said source and said drain are determined in part by size and shape of the control gate and the overlay of said control gate with said source and said drain, the ratio of said capacitances and charge thereon determining conductance of said third and fourth transistors.

5. The static memory cell as defined by claim 4 wherein said third MOS transistor and said fourth MOS transistor are biased below conduction threshold.

6. The static memory cell as defined by claim 1 when said third MOS transistor and said fourth MOS transistor are biased below conduction threshold.

* * * * *